US007103860B2

(12) United States Patent
Price et al.

(10) Patent No.: US 7,103,860 B2
(45) Date of Patent: Sep. 5, 2006

(54) VERIFICATION OF EMBEDDED TEST STRUCTURES IN CIRCUIT DESIGNS

(75) Inventors: Paul Price, Stoughton, MA (US); Jean-François Côté, Chelsea (CA); Ajit Kumar Verma, San Jose, CA (US)

(73) Assignee: LogicVision, Inc., San Jose, CA (US)

( * ) Notice: Subject to any disclaimer, the term of this patent is extended or adjusted under 35 U.S.C. 154(b) by 375 days.

(21) Appl. No.: 10/349,452

(22) Filed: Jan. 23, 2003

(65) Prior Publication Data

US 2003/0149949 A1 Aug. 7, 2003

Related U.S. Application Data

(60) Provisional application No. 60/354,016, filed on Feb. 5, 2002, provisional application No. 60/354,015, filed on Feb. 5, 2002, provisional application No. 60/350,979, filed on Jan. 25, 2002.

(51) Int. Cl.
*G06F 17/50* (2006.01)

(52) U.S. Cl. ............... 716/4; 716/5; 702/117; 703/20

(58) Field of Classification Search ........... 716/4, 716/5; 702/117; 703/20
See application file for complete search history.

(56) References Cited

U.S. PATENT DOCUMENTS

| 5,535,223 | A | * | 7/1996 | Horstmann et al. ......... 714/744 |
| 5,870,308 | A | | 2/1999 | Dangelo et al. |
| 5,903,475 | A | * | 5/1999 | Gupte et al. ................. 703/16 |
| 5,923,867 | A | | 7/1999 | Hand |
| 5,953,519 | A | * | 9/1999 | Fura ............................ 716/18 |
| 5,971,596 | A | * | 10/1999 | Nishikawa ................... 716/10 |
| 5,995,736 | A | | 11/1999 | Aleksic et al. |
| 6,012,155 | A | | 1/2000 | Beausang et al. |
| 6,083,269 | A | * | 7/2000 | Graef et al. ................... 703/14 |
| 6,141,790 | A | | 10/2000 | Beausang et al. |
| 6,269,467 | B1 | * | 7/2001 | Chang et al. ................... 716/1 |
| 6,321,186 | B1 | | 11/2001 | Yuan et al. |
| 6,425,113 | B1 | | 7/2002 | Anderson et al. |
| 6,427,225 | B1 | | 7/2002 | Kitada et al. |
| 6,675,310 | B1 | * | 1/2004 | Bloom et al. ............... 713/500 |
| 6,678,875 | B1 | * | 1/2004 | Pajak et al. .................. 716/11 |
| 6,725,435 | B1 | * | 4/2004 | Cote et al. ...................... 716/5 |
| 6,862,717 | B1 | * | 3/2005 | Nadeau-Dostie et al. ...... 716/4 |
| 2002/0188432 | A1 | * | 12/2002 | Houlihane et al. ............ 703/20 |
| 2005/0004777 | A1 | * | 1/2005 | Houlihane .................... 702/119 |

OTHER PUBLICATIONS

M. Bell et al., Bridging the Gap Between Embedded Test and ATE, Proceedings of the Internation Test Conference, pp. 55-63, Oct. 2000.*

(Continued)

*Primary Examiner*—A. M. Thompson
(74) *Attorney, Agent, or Firm*—Eugene E. Proulx

(57) ABSTRACT

A program product for use in generating test benches for verifying test structures embedded in a circuit, comprises a verification specification processor for parsing a verification specification containing test specifications for selected test structures and a test bench generator for each of one or more types of embedded test structures, each test bench generator being operable to process a test structure specification of a test structure of a corresponding test structure type and generate a test bench using data contained in said test specifications of said verification specification, data contained in said test structure specification and data contained in a test connection specification.

55 Claims, 11 Drawing Sheets

OTHER PUBLICATIONS

K. Pierce et al., High Performance CMOS array with An Embedded Test Structure, Proceedings of the IEEE 1990 Custom Integrated Circuits Conference, pp. 4.1/1-4.1/4, May 1990.*

D. Sobczak, Embedded Test Structures Reduce ASIC Time-to Market, 4th Annual IEEE International ASIC Conference and Exhibit, pp. P7-6/1-3, Sep. 1991.*

Z. Kotasek et al., Test Scheduling for Embedded systems, Proceedings of the Euromicro Symposium on Digital System Design, pp. 463-467, Sep. 2003.*

Y. Zorian, System-chip test strategies, Proceedings of the 35th Annual Conference on Design Automation, pp. 752-757, May 1998.*

* cited by examiner

*etv_startup* *(<designName>) {*
*ClockPeriods* *{*
*<pinName>: period s | ms | us | (ns) | ps;*

//Repeat for each clock pin.

```
1                    GLOBAL OPTIONS SECTION
2     { Global Parameters - applicable to all test structures }
3
4                    TESTER RELATED DATA SECTION
5     { Automated Testing Equipment parameters }
6
7                    VECTOR GENERATION SECTION
8     { Vector generation parameters }
9
10                   SPECIFIC VERIFICATION SECTION
11    { Test Structure and test step parameters }
12    Test Structure Type A Wrapper {
13        Generic Test Structure Type Parameters
14        Test Step 1  Wrapper (
15            Test Step 1 Parameters
16                Test Structure 1 Wrapper (
17                    Test Structure 1 Specific Parameters
18                } // end of Test Structure 1 Wrapper
19
20                Test Structure 2 Wrapper (
21                    Test Structure 2 Specific Parameters
22                } // end of Test Structure 2 Wrapper
23        } // end of Test Step 1 Wrapper
24
25        Test Step 2 Wrapper {
26            Test Step 2 Parameters
27                Test Structure 3 Wrapper (
28                    { Test Structure 3 Specific Parameters
29                } // end of Test Structure 3 Wrapper
30
31                Test Structure 4 Wrapper (
32                    { Test Structure 4 Specific Parameters
33                } // end of Test Structure 4 Wrapper
34
35        } // end of Test Step 2 Wrapper
36    } // end of Test Structure Type A Test Structures
37
38    Test Structure Type B Wrapper {
39        Generic Test Structure Type Parameters
40        Test Step 1  Wrapper (
41            Test Structure 5 Wrapper (
42            Test Structure 6 Wrapper (
43        Test Step 2 Wrapper
44            Test Structure 7 Wrapper (
45            Test Structure 8 Wrapper (
46    } // end of Test Structure Type B Test Structures
```

Fig. 11.

```
1   logicbistVerify(UNITB_COLLAR) {
2       PatternName              : logicbistv_UNITB_COLLAR;
3       SimulationScript         : UNITB_COLLAR_sim.script;
4       TestClockSource          : System;// CLKA1
5       ClockPeriod              : 40ns;
6       TckRatio                 : 8;
7
8       TestStep ( ParallelLoad ) {
9           ParallelLoad         : On;
10          Controller ( BP1 ) { //UNITB_COLLAR_LVISION_LOGICTEST
11              StartVector      : 1;
12              EndVector        : 16;
13          }
14      }
15      TestStep ( SerialLoad ) {
16          PowerLevel           : P7_8;
17          Controller ( BP1 ) { //UNITB_COLLAR_LVISION_LOGICTEST
18              StartVector      : 1;
19              EndVector        : 2;
20          }
21      }
22      TestStep ( Diagnostic ) {
23          Diagnostic           : On;
24          Controller ( BP1 ) { //UNITB_COLLAR_LVISION_LOGICTEST
25              StartVector      : 1;
26              EndVector        : 1;
27          }
28      }
29      TestStep ( HWDefaultTest ) {
30          RunMode              : HWDefaultTest;
31          ParallelLoad         : On;
32          Controller ( BP1 ) { //UNITB_COLLAR_LVISION_LOGICTEST
33          }
34      }
35  }
```

VERIFICATION OF EMBEDDED TEST STRUCTURES IN CIRCUIT DESIGNS

CROSS-REFERENCE TO RELATED APPLICATIONS

This application claims the benefit of Provisional Application Ser. No. 60/354,016 filed Feb. 5, 2002.

This application is related to U.S. Provisional Application Ser. No. 60/354,015 filed Feb. 5, 2002 for "Method and Program Product for Completing a Chip Design Having Embedded Test Structures", incorporated herein by reference.

This application is related to U.S. Provisional Application Ser. No. 60/350,979 filed Jan. 25, 2002 for "Method and Program Product for Creating and Maintaining a Self-Contained Design Environment", incorporated herein by reference.

BACKGROUND OF THE INVENTION

1. Field of the Invention

The present invention relates, in general, to integrated circuit design and, more specifically, integration of test structures into circuit designs and verification of the resulting design.

2. Description of Related Art

As integrated circuits continue to become increasingly more complex, it is becoming increasingly more important to embed into the circuits test structures or objects which can be used during and after manufacture to test the circuit and its various sub-circuits and components. The generation, integration and verification of these test structures is complex and tedious because a circuit may require many specialized test structures and may include embedded circuit blocks which also require test structures. By way of example, FIG. 1 illustrates a relatively simple test ready circuit 10 having a variety of embedded test structures. The circuit includes an embedded circuit block 12 which has logic 14, a dynamic random access memory (DRAM) 16, and a legacy core 18. The test structures which are embedded in embedded block 12 include a logic test controller 20 associated with logic 14, a memory test controller 22 associated with DRAM 16 and a core socket 24 which provides isolation and access to legacy core 18. Top module 30 of circuit 10 includes logic 32, two memory units, including a static Random access memory (SRAM) 34 and read only memory (ROM) 36, a phase locked loop (PLL) 38, an analog-to-digital converter (ADC) 40 and a number of circuit input and output pins. The test structures which were added to the top module include a logic test controller 42 associated with logic 32, a memory test controller 44 associated with SRAM 34 and ROM 36, a phase locked loop test controller 46 associated with PLL 38, an ADC test controller 48 associated with ADC 40, interconnect test controllers 50, 52, and 54, and a test access port (TAP) 56 connected to the various test controllers. Logic blocks 14 and 32 are comprised of memory elements and combinational gates. Memory elements were converted to scannable memory elements and arranged into scan chains. In general, embedded test controllers generate test vectors and analyze output response of sub-circuits and components. The embedded test structures are used cooperatively for testing sub-blocks, which may be buried deep within an embedded block, from the circuit pins such as the test access port.

Automation tools, available from the patentee, LogicVision, Inc. of San Jose, Calif., may be used to generate and verify the test structures and assemble them into a circuit description of a circuit under development. Generally, each test structure has a specialized set of automation tools which provide several optional features, which or may not be included in a particular circuit, depending on the desires of the designer.

Thus, in addition to the complexity of the circuit itself and of the test structures which must be designed into the circuit, a designer faces the additional complexity of operating various automation tools which must be used to analyze the circuit, create the appropriate test structures, create test vectors and patterns to test the circuit, importantly, verify the test structures to ensure that they operate according to design specifications.

Once all test structures have been embedded in the circuit and the circuit design process is substantially complete, all embedded test structures must be verified again, possibly several times, prior to manufacture of the circuit as well as after manufacture.

The embedded test verification process varies from test structure to test structure, but, in general, the process involves operating test controllers in all of their respective modes of operation, and includes generating test benches and scripts to exercise the test controllers on a circuit simulator.

Dedicated verification tools have been developed in an effort to facilitate the verification process. For example, a logic test controller verification tool is required for logic test controllers, a memory test controller verification tool is required for memory test controllers, etc. As indicated above, it is often necessary to run a verification tool several times to test the various modes of a controller. typically a test controller is verified after it has been generated (created), but before it has been integrated into the circuit. This involves exercising the controller directly from its ports. It is verified again after the controller has been integrated into the circuit. This involves exercising the controller more remotely, i.e. from its ports of the circuit. The controller is verified again after top module test structures, such as a TAP, have been inserted into the circuit. In this case, the controller exercised from the TAP to circuit block ports and from the block ports to the controller ports. Finally, all test controllers must be verified again during a test structure sign-off flow. This verification procedure must be performed for each test controller. In the circuit of FIG. 1, there are at least nine test controllers, the test access port, various scan chains and other test structures which must be verified.

It will be seen, then, that each verification tool must be operated several times during the course of embedding test structures into a circuit and that there may be many verification tools which must be used. Clearly, the test structure verification process is complex.

There is a need for a single, unified verification tool and method for simplifying the verification process in circuits having embedded test structures and that can be used during test structure embedding phase of a circuit design, as well as during the final circuit verification phase of circuit design. There is also a need for a verification tool that will generate a test program that will test all test structures in the circuit prior to and after manufacture.

SUMMARY OF THE INVENTION

The present invention seeks to provide a method and program product for facilitating the verification of embedded test structures during the design of a circuit and for facilitating the generation of test program(s) which use the embedded test structures to test the circuit after manufacture.

The method involves creating a test connection specification by parsing a description of a circuit or module to identify embedded test structures. In hierarchical designs having embedded cores which have been signed off, the test connection specifications which were generated for the embedded cores are incorporated into the circuit test connection specification, thereby avoiding the need to repeat this procedure with respect to the embedded cores. The test connection specification identifies test structures, module ports to which the structure is connected, the test structure type and the location of a test structure specification which contains information required to create test benches. A verification specification is then created by parsing the test connection specification and providing a specific verification specification for each test structure in the test connection specification. The verification specification includes test bench generation tool parameters and predetermined test specifications corresponding to the test structure type. Using the information contained in the test connection specification, the parameters and test specifications contained in the verification specification and the specifications contained in the test structure specification, a test bench is created for each sub-group of a test structure type.

One aspect of the present invention is generally defined as a program product for use in generating test benches for use in verifying test structures embedded in a circuit, comprising a verification specification processor for parsing a verification specification containing test specifications for selected test structures; a test bench generator for each of one or more types of embedded test structures, each test bench generator being operable to process a test structure specification of a test structure of a corresponding test structure type and generate a test bench using data contained in the test specifications of the verification specification, data contained in the test structure specification and data contained in a test connection specification.

Another aspect of the present invention is generally defined as a method for generating test benches for operationally verifying embedded test structures in a circuit, comprising: specifying embedded test structures to be verified; parsing a verification specification containing test specifications for test structures in the circuit, the test specifications being grouped by test structure type, each test structure type group containing test structure type global parameters and test steps parameters for verifying test structures within the group; and for each specified embedded test structure type, generating a test bench according to the global test structure type parameters and test parameters contained in corresponding test structure type group.

A further aspect of the present invention is generally defined as A method of generating test benches for a circuit having embedded test structures, comprising: generating a test connection specification identifying embedded test structures in the circuit; generating a verification specification having a specific verification section in which the test structures are grouped by test structure type and each test structure type group includes test structure type global parameters and parameters for each of predetermined test steps required to verify test structures in the group; and generating a test bench corresponding to each test structure type group.

BRIEF DESCRIPTION OF THE DRAWINGS

These and other features of the invention will become more apparent from the following description in which reference is made to the appended drawings in which:

FIG. 9 illustrates a clock specification;

FIG. 10 illustrates a verification specification format according to an embodiment of the present invention; and FIG. 11 illustrates a logic test controller specific verification wrapper containing actual test structure type global parameters, test step parameters and test structure specific parameters.

DETAILED DESCRIPTION

In the following detailed description, numerous specific details are set forth in order to provide a thorough understanding of the present invention, However, it will be understood by those skilled in the art that the present invention may be practiced without these specific details. In other instances, well known methods, procedures, components and circuits have not been described in detail so as not to obscure aspects of the present invention.

The present invention provides a method and program product for facilitating the verification of embedded test structures during the design of a circuit and for facilitating the generation of test program(s) which use the embedded test structures for testing the circuit after manufacture.

The term "test structure" generally refers to circuitry which is inserted into a circuit for use in testing the circuit. As will be seen from the following description, the test structures may take various forms, including test controller circuitry of various types, test access ports, boundary scan cells, test collars, scannable memory elements, scan chains, and so forth. The details of these structures is not important in order to understand the present invention and, accordingly, the structures are not described in any detail.

Figure 1:
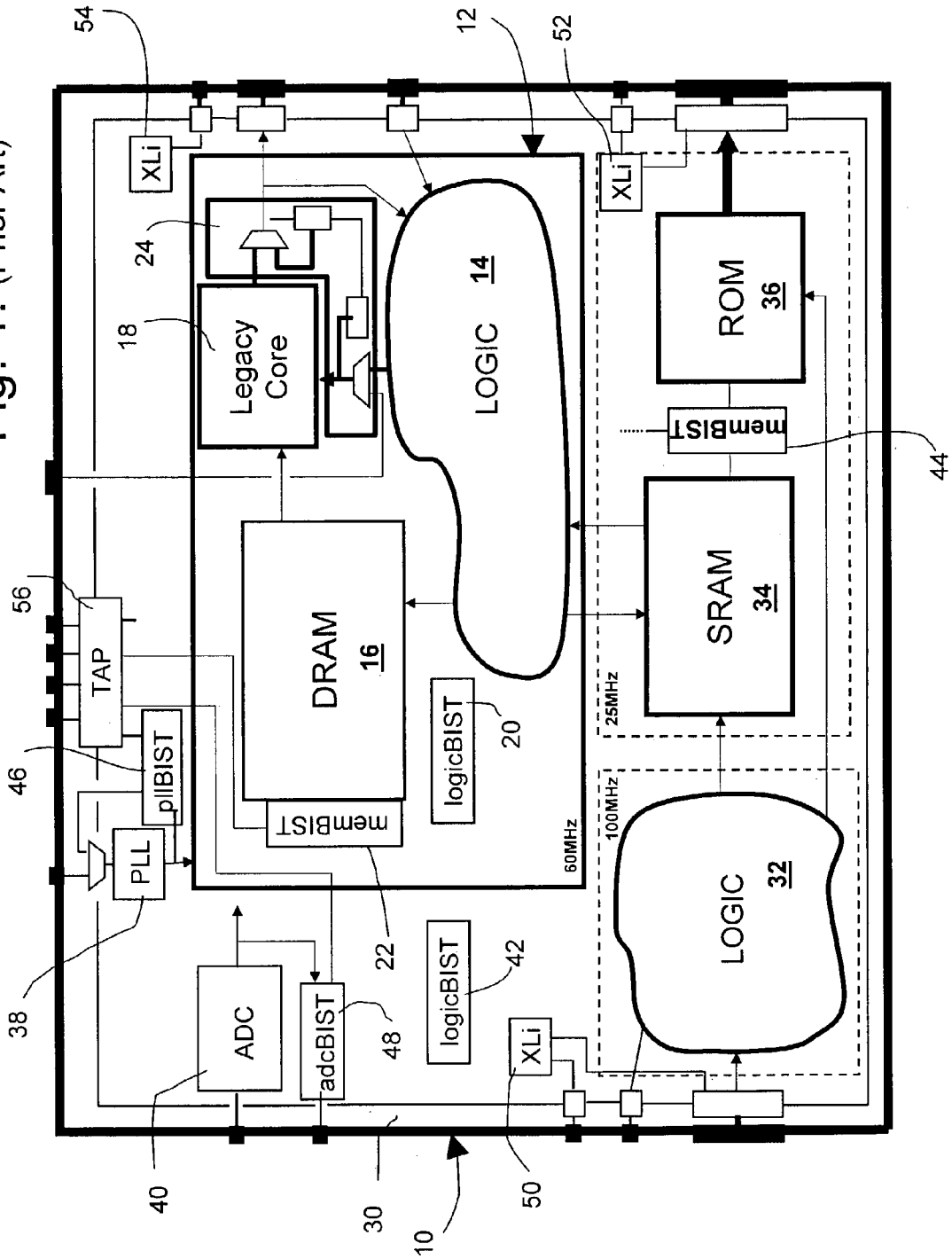
FIG. 1 is a diagrammatic view of a circuit having an embedded circuit block and a plurality of specialized test structures.
Figure 2:
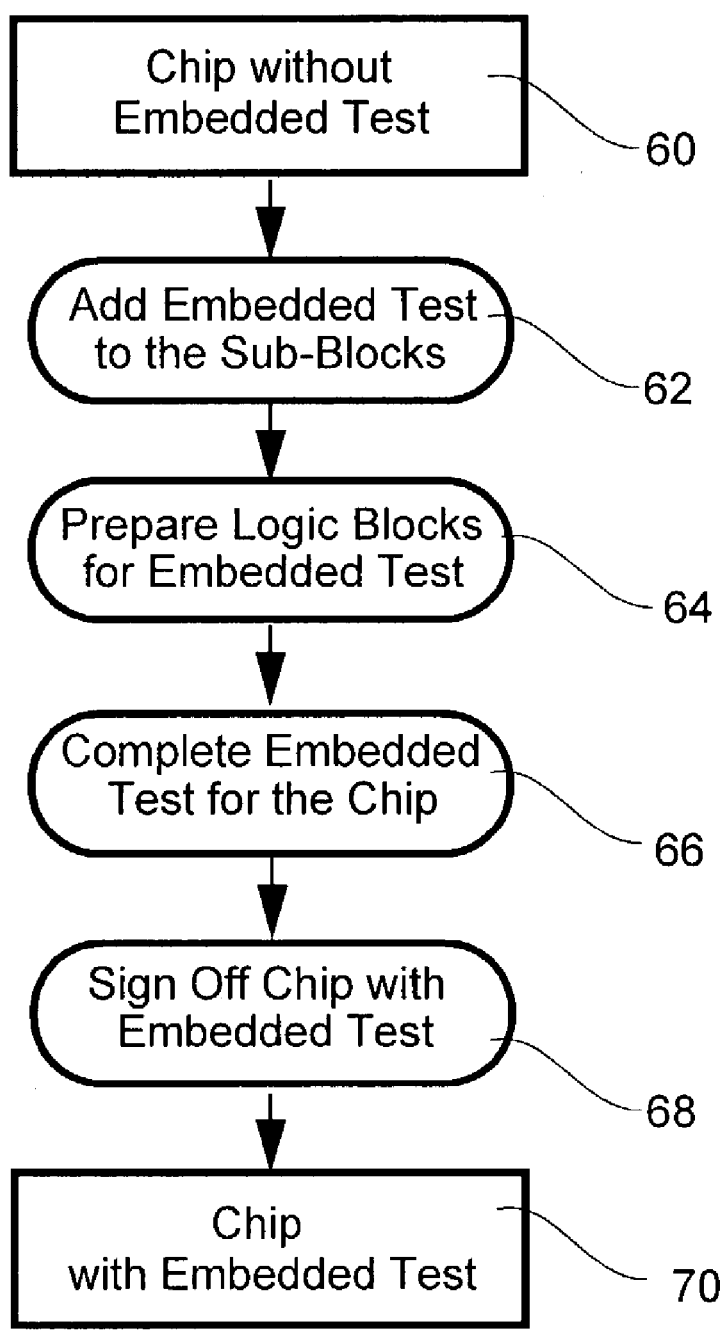
FIG. 2 is a block diagrammatic view of an embedded test design flow for use in generating and integrating circuit test structures into a circuit according to a preferred embodiment of the present invention.

FIG. 2 diagrammatically illustrates an embedded test design flow in which embedded test structures are added to a circuit design 60. The design flow includes four phases including a sub-block flow 62, a prepare logic flow 64, a top-level flow 66 and a sign-off flow 68 which results in a test ready circuit design 70.

Figure 3:
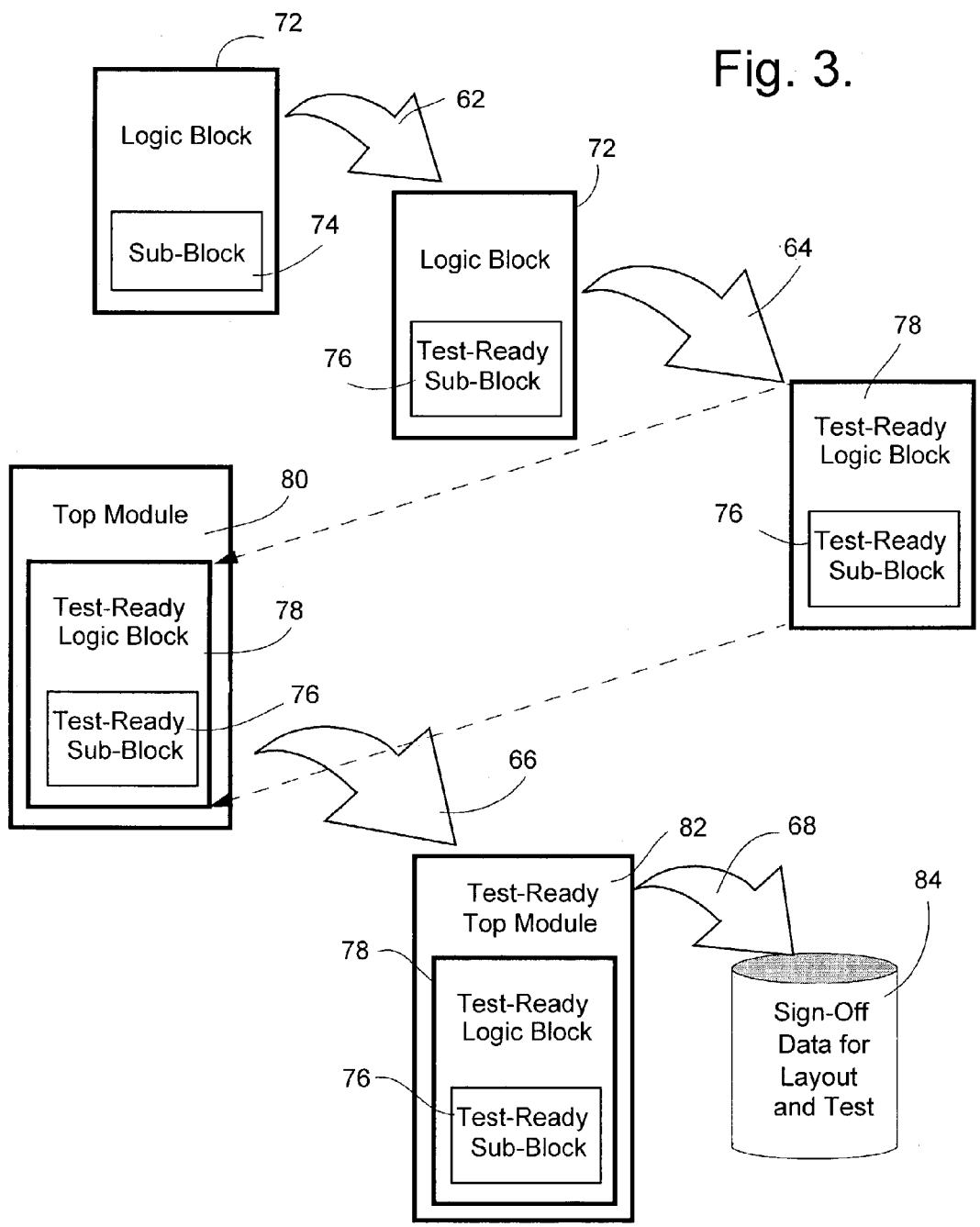
FIG. 3 is a more detailed diagrammatic view of the embedded test design flow according to an embodiment of the present invention.

Sub-block flow 62 involves creating embedded test structures for use with sub-blocks in top-level logic blocks. Sub-blocks are components such as memories, phase-locked loops (PLLs), legacy cores and the like. FIG. 3 shows a top-level logic block 72 having a sub-block 74. Block 72 may include many sub-blocks which require embedded test, in which case a portion (generation and verification of test structures) of the sub-block flow is performed on each sub-block. In the sub-block flow, the embedded test structures include Built-In Self-Test (BIST) for sub-blocks such as memories and phase-locked loops (PLLs), while, for sub-blocks such as legacy cores, the embedded test structures include access and isolation structures. The details of the embedded test structures vary depending on the type of sub-block. The test structures are verified, by simulation directly from the test structure ports, after the structures have been created by an generation automation tool. The embedded test structures for the sub-blocks are assembled into the top-level logic block. This results in test ready sub-blocks 76. The test connections are made available at the top allowing a block verification flow to take place. The top level block is verified after all sub-block test structures have been assembled into the block. In this case, the test structures are exercised from the ports of the circuit block, and, therefore, verification becomes somewhat more complex.

Prepare Logic Flow 64 prepares top-level logic blocks 72 for embedded test. In this phase, logic is rule-checked and made scannable, fault coverage is calculated, and, optionally, test points are added. The test structures are in the form of scan chains. Before proceeding to the next step of the embedded test design flow, the structures which were added to the block are verified by simulation. This phase results in a test-ready logic block 78 having one or more test ready sub-blocks 26. A circuit may include several top level blocks 72 which require preparation in this manner.

Top-Level Flow 66 completes integration of embedded test capabilities into a circuit design. In this phase, embedded test structures are added to the top-level module 80 of the circuit. The embedded test structures in this phase may include structures such as a test-access port (TAP) (not shown), boundary scan, logic test controllers, and other embedded test capabilities. After all top level test structures have been created and assembled into the circuit description, all test structures in the circuit are verified by simulation from the top of the circuit. Since sub-block test structures are no longer "directly" accessible, they must be accessed from circuit pins or a test access port.

The top-level flow phase results in a test ready top module 82 having one or more test ready logic blocks 78 having one or more test ready sub-blocks 76. Circuit 60 may initially be in the form of several sub-circuits which are processed individually, resulting in a plurality of test ready sub-circuits 80. Each of the above flows includes various forms of analyses and verification procedures to ensure that the embedded test structures are individually functional and operable according to embedded test design. However, prior to manufacture, it is necessary re-verify all test structures. This is the purpose of embedded test sign-off flow 68.

Sign-Off Flow 68 creates and verifies a final circuit description, test vectors and test patterns for signing-off embedded test structures of the circuit. In this phase, a concatenated, hierarchical circuit description and the final test vectors and test patterns are created for hand-off to manufacturing, a sign-off verification of the embedded test in this description is performed and a hand-off database is created. The signoff flow can be used on embedded cores or complete circuits. The preferred sign-off flow is described and claimed in companion U.S. application Ser. No. 10/323,815 filed Dec. 23, 2002 for "Method and Program Product for Completing a Circuit having Embedded Test Structures", now U.S. Pat. No. 6,725,435 issued Apr. 20, 2004, incorporated herein by reference.

In each of the four phases, various software tools perform various tasks, including generating embedded test structures and access mechanisms, integrating embedded test structures into the design, analyzing a design with or without embedded test structures, and verifying a design that contains embedded test using simulating testbenches.

Each of the test structures is designed with at least one mode of operation. Each mode must be verified. Some modes may require several test steps. The details of the test structures and modes of operation are not important for the purposes of the present invention.

It will be seen from the foregoing that a test ready circuit may have many blocks or modules, many test controllers of different types, many controllers of the same type but with different connections, attributes and features. It will be appreciated, therefore, that verification of the test structures is a daunting task. The present invention seeks to provide a method and a tool which considerably simplifies the process.

Verification Automation Tool

Figure 4:
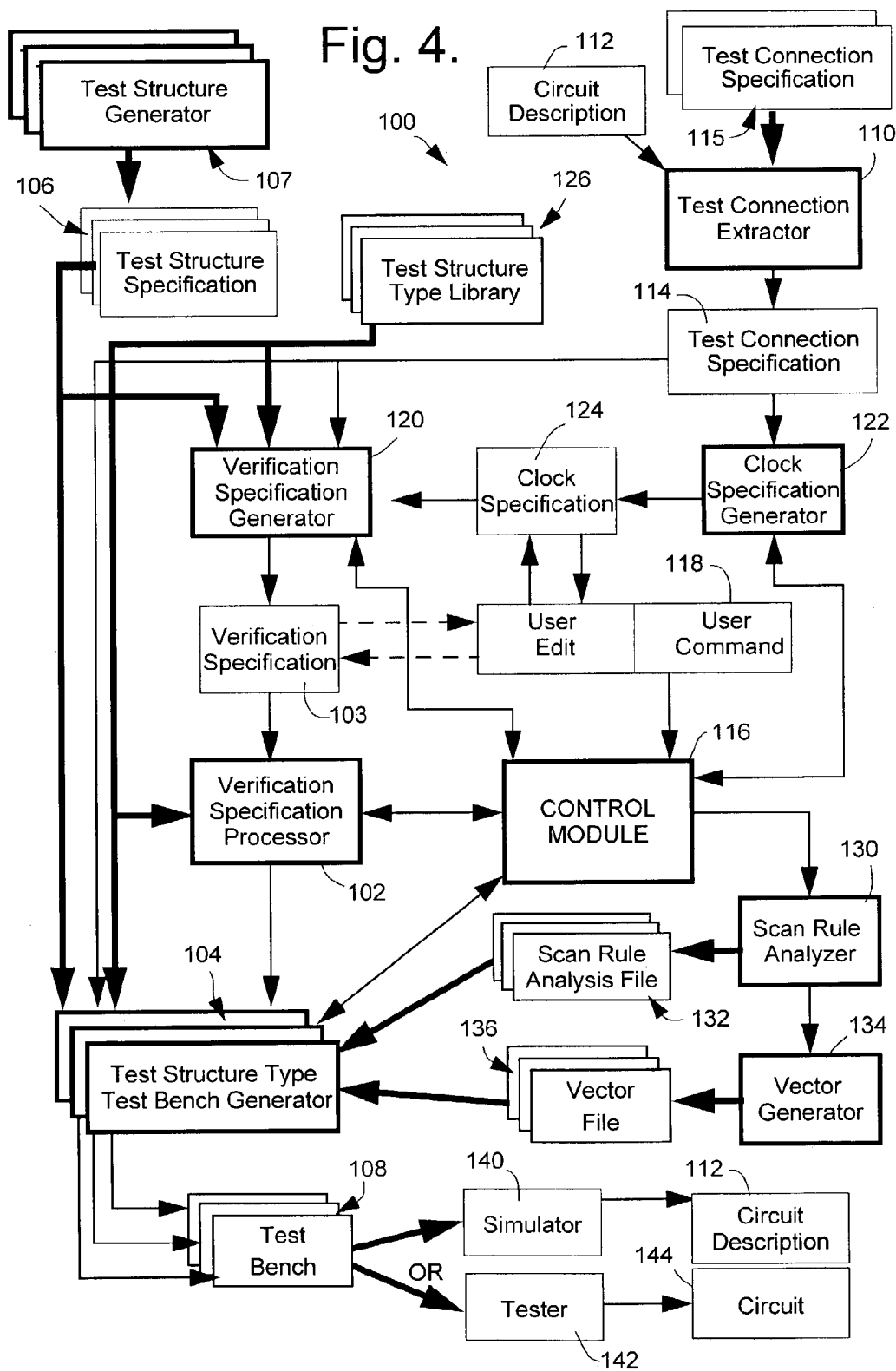
FIG. 4 is a block diagram illustration of a verification tool according to an embodiment of the present invention.

FIG. 4 diagrammatically illustrates an embedded test structure verification automation tool 100, according to an embodiment of the present invention, for generating test benches that are used in verifying selected test structures embedded in a circuit. The circuit may be any circuit including a sub-block of a circuit, a circuit block in a circuit, an embedded block, or a circuit having one or more embedded blocks.

The tool comprises a verification specification processor 102 for parsing a verification specification 103 which contains test specifications for selected test structures. The verification specification and the manner in which it is generated are described later. The selected test structures may range from a single test structure, a group of structures of the same type, one or more groups of different types or all of the embedded test structures in the circuit.

The tool also comprises a test bench generator 104 for each of one or more types of embedded test structures. Each test bench generator is operable to process a test structure specification 106 of a corresponding test structure type and to generate a test bench 108 using data contained in the test specifications of the verification specification, data contained in the test structure specification and data contained in a test connection specification. The test structure specifications 106 are preferably created by test structure generation automation tools 107. The test benches are formatted to be used on a simulator 140 for simulating circuit description 112 or on a tester 142 for testing a manufactured circuit 144.

Verification tool 100 further includes a test connection extraction module 110 which parses a circuit description 112 and generates a circuit test connection specification 114 which identifies the test structures in the circuit. The test connection specification 114 contains, for each test structure, the test structure name or identifier, the test structure type, the identity of a test structure specification and the identity of circuit ports to which test structure ports are connected. The test connection specification is described in more detail later. Test connection extraction utility 110 is also operable to parse test connection specifications 115 associated with embedded blocks so as to include within the test connection specification of the circuit to be verified, test connection specifications for test structures which are embedded in the embedded blocks. The identity of the embedded blocks is determined from the circuit description. The embedded block test connection specifications will also include a test structure identifier, a test structure type, the identity of its corresponding test structure specification and the identity of circuit ports to which test structure ports are connected.

A control module 116 coordinates the various operations and functions of the tool including interacting with a user 118 by means of a command processor included in the control module. The command processor is responsive to a user input for determining the circuit to be verified, the type of verification to be performed and the test structures to be verified. In response to an appropriate user command, the control module processes a verification specification 103 and, for each test structure type, invokes a corresponding test bench generator 104 and passes to the test bench generator, global test structure type parameters and test specifications associated with the group. In response to another user command, the control module invokes a verification specification generator described below. When required, the control module invokes a scan rule analyzer 130 which generates scan rule analysis files or specifications 132. Scan rule analyzer invokes a vector generator 134 when required to generate vector files 136.

Each test bench generator 104 is operable to extract from a test connection specification 114, the identity and location of a test structure specification 106 and the connections between a test structure and the circuit module in which the test structure is embedded, extract from the test structure specification 106, test structure specific information required in a test bench 108 and extract from a verification specification 103, parameters to be used in generating the test benches. Test bench generators 104 are also designed to process scan rule analysis files 132 and test vector files 136.

Verification tool 100 further includes a verification specification generator 120 for generating a verification specification 103 and for storing the specification as an electronic file. The verification specification is preferably in the form of a text file which can be edited by a user using a text editor. Specification generator 120 groups test structures identified in a test connection specification 114 by test structure type with each test structure type group defining one or more test step specifications for one or more test structures of the same test structure type, and provides for each test structure group, global test structure type parameters and test step parameters for verifying test structures of said test structure type. This is described more fully later with reference to FIG. 7. FIG. 10 illustrates the content and structure of a verification specification according to a preferred embodiment of the invention. The verification specification generator may also group test structures of each test structure type group into one or more sub-groups including hierarchical sub-groups, frequency sub-groups, and power consumption sub-groups.

The verification specification generator preferably has one or more selective modes of operation for generating one or more types of verification specifications. The modes include an early verification mode for generating a verification specification used for performing an accelerated and/or preliminary verification of test structures in the circuit, a scan verification mode for generating a verification specification used for verifying scan related structures in the circuit, and a sign-off verification mode for generating a first verification specification for use in performing a complete verification of all test structures in the circuit prior to manufacture of the circuit and a second verification specification for use in testing the circuit after manufacture of the circuit.

Verification tool 100 further includes a clock specification generator 122 for parsing a test connection specification 114 and producing a clock specification 124 which identifies the clock source driving each test controller module and creates a clock specification, such as shown in FIG. 9. The clock specification identifies each test controller clock source and a corresponding clock period. The verification specification generator is operable to extract clock period values from the clock specification and insert the values wherever required in the verification specification.

Verification specification generator 120 is further operable to insert circuit specific data at place holder locations in the verification specification. The data is extracted from test connection specifications 114, test structure specifications 106, and clock specification 124. Test structure type parameters and test step parameters are extracted from a test structure type library 126.

As previously mentioned, the verification specification generator is responsive to user input for selectively including or excluding test structures in or from a verification specification.

Verification Specification

FIG. 10 illustrates the general format of a verification specification 103. The verification specification may have up to four sections with each section containing parameters which the test bench generators use to construct test benches 108. A Global Options Section (lines 1–3) contains global parameters which are applicable to all test structure types and, accordingly, this section appears in all verification specifications. These properties could include properties such as IncludeAllNonPowerPins which instructs the tool to include ports that are not power, ground, analog, or no-connect pins in a top-level portlist of the generated testbench and IncludeAllPowerPins which instructs the tool to include all power, ground, analog, and no-connect pins to the top-level portlist in the test benches.

A Tester Related Data Section (lines 4–6) is included only in aforementioned second verification specification which is used for testing the circuit after manufacture of the circuit. When the verification tool creates verification specifications, the tool extracts tester data requirements from an ATE vendor file (not shown), which is specified by the user, and stores default tester-related data in this section of "SignOff" and "Manufacturing" verification specifications. Once the files are created, the user may need to edit verification tool assigned property values.

A Vector Generation Section (lines 7–9) is included for a circuit which requires the generation of test vectors. This section contains vector and signature information used to create a set of logic test vectors and signatures for early verification of a portion of a circuit. This section is especially useful during early verification (early verification is the verification performed on a test controller after the controller has been generated, but before it has been assembled into the circuit) when only a few vectors at the beginning and a few vectors at the end of a vector set are required. This will speed up the verification process. The syntax in this section comprises a primary LogicTestVectors wrapper and sub-wrappers and properties, and enable a user to specify a desired fault coverage for scan test with ATPG (automatic test pattern generation), the number of random patterns for logic BIST, and optional logic BIST diagnostic vectors.

A Specific Verification Section (lines 10–46) contains at least one wrapper for each test structure type which will be used to generate a test bench or test pattern for each wrapper. More than one wrapper can be provided for test structures of the same type; however, each wrapper must have a unique name because, as mentioned, each wrapper results in a test bench of its own. By default, the verification tool generates a wrapper for all embedded test controllers and structures integrated into the design. However, the tool can be restricted to process a smaller set of wrappers by using -select and -exclude runtime options.

Each test structure type wrapper contains global test structure type parameters and test specifications in the form of one or more test step wrappers. The specific verification section in FIG. 10 includes two test structure type wrappers including a first wrapper (lines 12–34) labeled Test Structure Type A Wrapper and a second wrapper (lines 38–46) labeled Test Structure Type B Wrapper. By way of example, Test structure type A could be memory test controllers and test structure type B could be logic test controllers. It will be appreciated by those skilled in the art that the verification specification may contain any number of test structure types wrappers and any number of test step wrappers.

Each test step wrapper contains global test step parameters and one or more test structure wrappers. The Test Structure Type A wrapper contains two test step wrappers: a first labeled Test Step 1 Wrapper (lines 14–23) and a second labeled Test Step 2 Wrapper (lines 25–35). Each test step wrapper contains two test structure wrappers. Each test structure wrapper contains test structure specific parameters. It will be noted that a test structure can appear in one or more test steps.

The global test structure type parameters and the global test step parameters are extracted from test structure type library 126 and apply to all test steps. FIG. 11 illustrates an actual logic test controller type wrapper, labeled LogicbistVerify, to illustrate global test structure type parameters, global test step parameters and test structure specific parameters for an embedded core called UnitB_Collar. The test structure type wrapper contains four test step wrappers which are used to test the four modes of operation (ParallelLoad, SerialLoad, Diagnostic, and HWDefaultTest) of a logic test controller called BP1. Lines 2–6 illustrate global test structure type parameters which apply to all test steps and all test controllers within the test steps. Lines 9, 16, 23, 30 and 31 illustrate global test step parameters that will apply to all test controllers within their respective test step wrapper. Lines 11, 12, 18, 19, 25, and 26 illustrate specific test structure parameters. It will be understood by those skilled in the art that the parameters will vary from one test structure developer to another; however, the principles would be essentially the same in all cases.

Method of Generating Verification Specification

Figure 5:
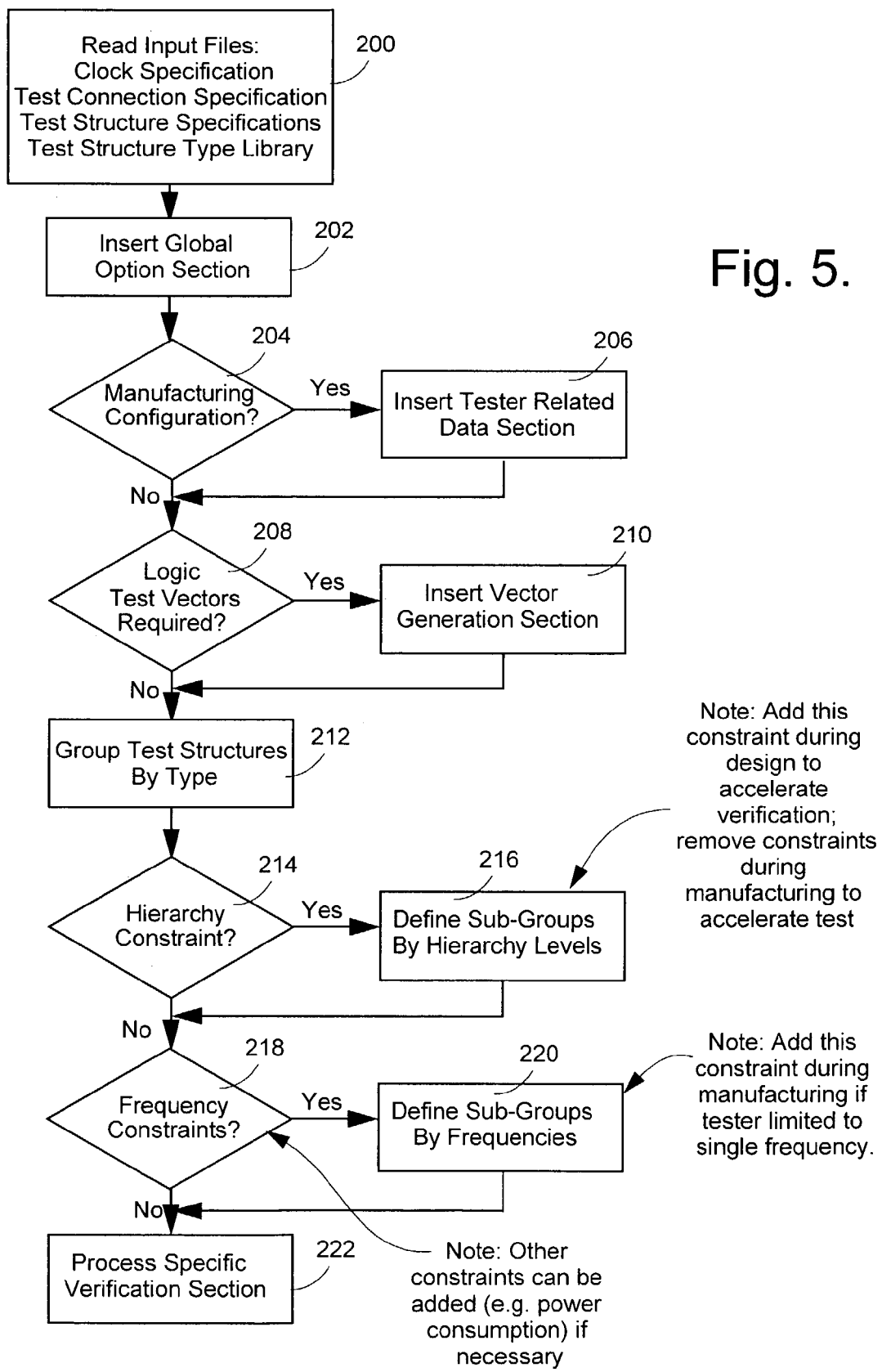
FIG. 5 is a flow chart illustrating a method of generating a verification specification according to an embodiment of the present invention.
Figure 6:
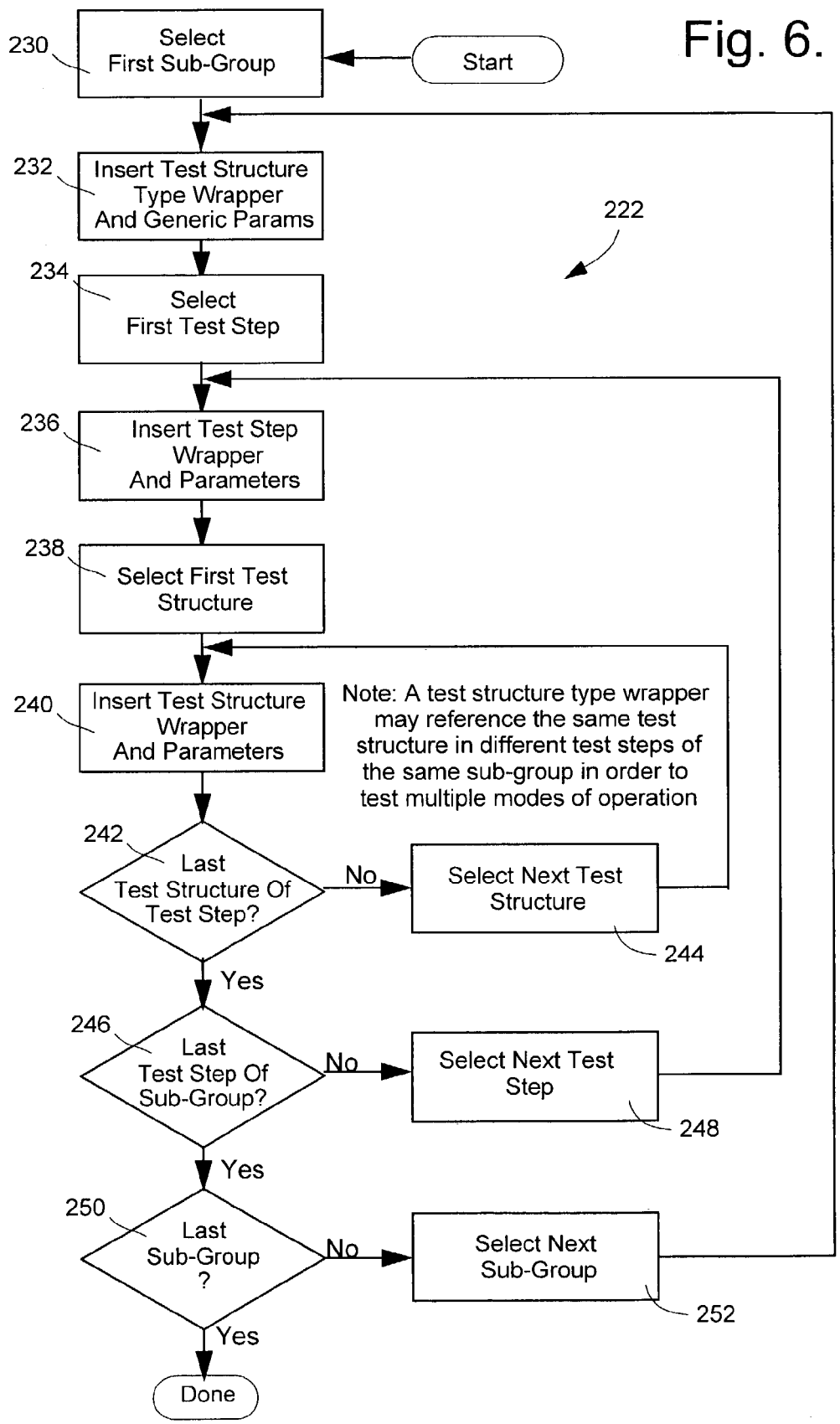
FIG. 6 is a flow chart illustrating a method of generating verification specifications for a verification specification according to an embodiment of the present invention.

Reference will now be made to FIG. 5 and 6 which illustrate a method of generating a verification specification according to an embodiment of the present invention.

The first step of the method is to read the various input files (step 200), which include the clock specification 124, the test connection specifications 114, the various test structure specifications and the test structure type library 126. The next step, step 202, is to insert a Global Options Section into a verification specification, as previously described. This is followed by determining whether a manufacturing verification specification is required (step 204). In a preferred embodiment, this is specified by entering a "sign-off" command line option when invoking the verification tool. If a manufacturing specification is required, a Tester Relation Section is generated and inserted into the verification specification (step 206).

Next is to determine whether logic test vectors are required (step 208). This is determined simply by checking the test structure type fields of the test connection specification for test controllers whose type is "logic test controller" or the like. If the circuit includes logic test controllers, a Vector Generation Section is extracted from library 126 and inserted into the verification specification (step 210).

The next series of steps relate to creating the Specific Verification Section of the verification specification.

First, the various test structures identified in the test connection specification are arranged into groups and, optionally, sub-groups. This will include test structures in circuit blocks which are embedded in the circuit. The first level of grouping is by test structure type (step 212). For example, all memory test controllers are grouped together, all logic test controllers are grouped together, all Phase locked Loop test controllers are grouped together and so forth.

Next and optionally, the test structures in each of the test structure type groups are arranged into sub-groups. Such a constraint would be specified during the design phase to accelerate verification. This constraint is not included in the manufacturing specification so as to accelerate testing of the manufactured circuit. Thus, in response to a Hierarchy group constraint (step 214), hierarchical sub-groups of test structures are created (step 216). That is to say, test structures located in different hierarchical levels are grouped separately so that they can be verified separately. Similarly, in response to a specified frequency constraint (step 218), the test structures may be grouped or arranged into frequency groups (step 220) so that test structures of the same test structure type and which operate at the same frequency will be verified together. It will be understood that the test structures into various other groups, such as power consumption groups, if desired.

With the test structure type groups and sub-groups defined, the Specification Verification Section of the verification specification can be created at step 222. This step is illustrated in detail in FIG. 6. As shown, a first test structure sub-group is selected (step 230) and a test structure type wrapper is inserted into the verification specification with global test structure type parameters extracted from library 126 (step 232). Next, a first test step is selected (step 234) and a test step wrapper is inserted (step 236) with predefined test step parameters extracted from library 126. Next, a first test structure in the sub-group (if sub-groups were created) is selected (step 238) and a test structure wrapper is inserted (step 240) within the test step wrapper. The test structure wrapper contains test structure parameters which are extracted from test structure specification 106. Each test structure in the sub-group is selected, in turn, (step 244) and a test corresponding test structure wrapper is inserted (step 240) into the verification specification until all test structures intended for the test step been processed (step 242).

The next test step is then processed (step 248) and steps 236-244 are repeated until all test steps have been processed (step 246) and corresponding test step wrappers and test structure wrappers have been created, completing the generation of the verification wrappers for the various structures in the first sub-group. The next sub-group is then selected (step 252) and steps 232-252 are repeated. This is repeated until all sub-groups of the first test structure type group have been processed (step 250). All test structure type groups are processed in the same manner.

As the verification specification generator creates the various wrappers, it will replace parameter placeholder values with circuit and test structure specific values and predetermined default values for other parameters so that the verification can be performed without further intervention by the user. For example, referring to FIG. 11, actual values of variables such as clock period, pattern names, script file names, pin names will be inserted into the file. However, the verification specification can be edited by the user if the user wishes to change some values prior to performing a verification.

When wrappers for all groups have been completed, the resulting verification specification is stored as a configuration file. The verification specification will contain all of the information required to generate test benches for exercising all selected test structures for verification. The verification specification can then be processed by verification specification processor 102 to generate test benches 108, as will now be explained with reference to FIGS. 7 and 8.

Figure 7:
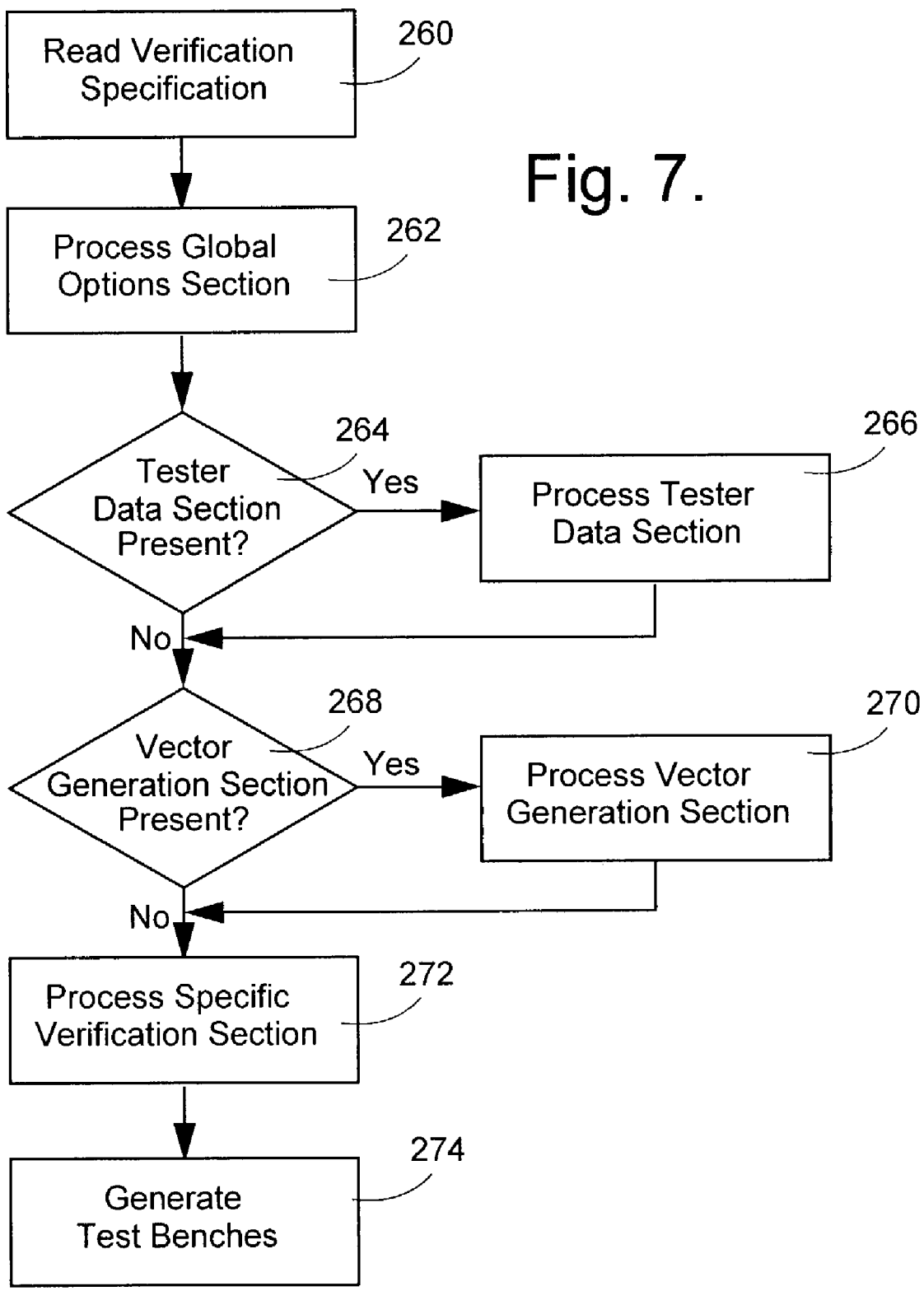
FIG. 7 is a flow chart illustrating a method of generating test benches using a verification specification which may be generated manually or, preferably, by a verification specification generator according to an embodiment of the present invention.

Referring to FIG. 7, the verification tool first opens the verification specification (step 260) and processes each section thereof in turn, including the global options section (step 262), the tester related data section (step 266), if it exists (step 264), the vector generation section (step 270), if included (step 268), and then the specific verification section (step 272). In one embodiment of the present invention, the verification specification processor generates a test structure type verification specification (not shown) for use by the corresponding test structure type test best generator. In another embodiment, the parameters contained within a test structure type wrapper are stored in computer memory for use by the corresponding test structure type test best generator. After processing each test structure type wrapper of the specific verification section, the verification tool generates and stores a test bench and a simulation script (step 274) for each sub-group of a test structure type wrapper.

Figure 8:
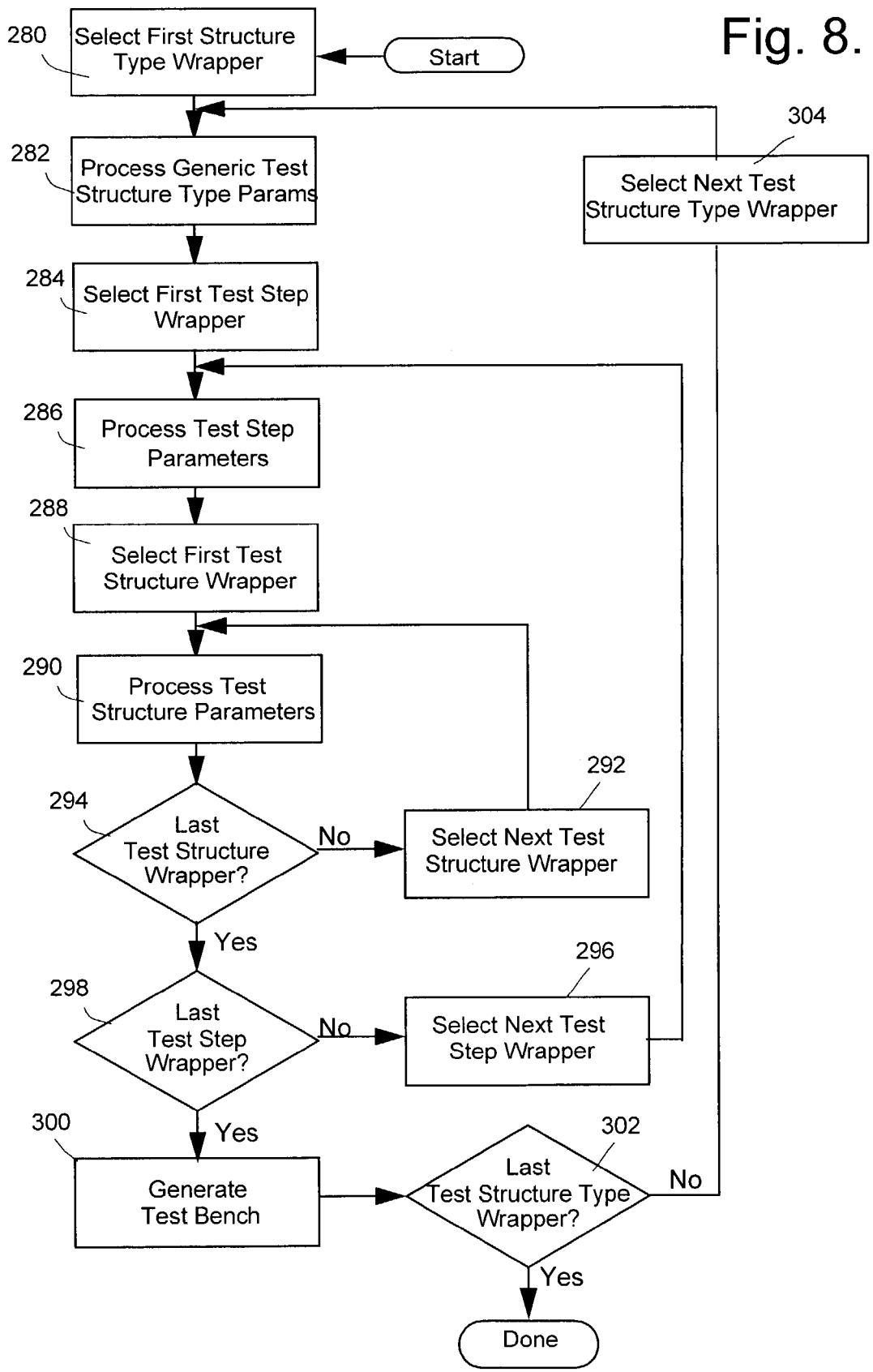
FIG. 8 is a flow chart illustrating a method of processing a specific verification section of a verification specification according to an embodiment of the present invention.

FIG. 8 is a flow chart illustrating the processing of the entire specific verification section by verification specification processor 102. Processor 102 provides input to the test bench generator 104. The test bench generator selects the first test structure type wrapper (step 280), processes the global test structure type parameters (step 282). It then selects the first test step wrapper (step 284) and processes the test step parameters (step 286) then selects (step 288) and processes (step 290) each of the test structure wrappers until all of the test structure wrappers in the test step wrapper have been processed (step 294). It then selects the next test step wrapper (if any)(step 296) and repeats steps 286 to 296 until all test step wrappers have been processed (step 298). The tool generates and stores a test bench and a simulation script (step 300) for each sub-group of the test structure type wrapper. The next test structure type wrapper is selected (step 304) and the process is repeated until all test structure type wrappers have been processed (step 302).

The test bench generator contains logic which depends on the parameters contained in the test structure type parameters. As previously mentioned, the test bench generator accesses the test structure specification 106, the test connection specification 106 and library 126 during the course of processing the verification specification in order to obtain all of the specific information required to create a test bench.

Test Structure Specification

As mentioned above, the present invention provides, for each test controller or structure, a test structure specification 106. For test controllers, the specification includes four sections for use in verification of the controller. These sections include a controller hardware (HSDL) section, a pattern and protocol (PGSL) section, a connection rules section and a parameter validation section. These sections are briefly described below.

(a) Controller Hardware Description

The controller hardware section indicates the controller type and delineates the inputs and outputs of the controller, and internal data registers used to configure the controller in various test and diagnosis modes.

The inputs and outputs are not necessarily the same for all controllers of the same controller type because each controller can be customized to designer needs. For example, a controller may have several diagnostic modes which are optional. The presence or absence of these modes will affect both the controller inputs/outputs and internal data registers.

```
port(CLK    : in bit;
     EN     : in bit;
     SI     : in bit;
     SO     : out bit_vector (3 down to 0);
     GO     : out bit;
     DONE   : out bit;
     SETUP  : in bit_vector (2 down to 0));
``` i. Opcodes

The controller hardware description also includes an Opcodes sub-section which delineates the name of each controller instruction and a bit value that is shifted into the instruction register of the TAP to put the TAP and controllers in a particular state. The following example is a description of a diagnostic mode instruction called DIAG_MODE for a controller called BP0 and the bit stream used to configure the controller in this mode:

```
attribute INSTRUCTION_OPCODE of TOP: entity is
    "BP0_DIAG_MODE      (XXXXXXXXXXXXX011X110110XXX011 ),"&
    "BP0_DATALOGGER_SETUP (XXXXXXXXXXXXXXXXX0X0111XXX011 ),"&
The Opcodes section includes one such entry for each controller instruction.
``` ii. Register Access

The controller contains serially accessible data registers. A register access section enumerates each bit or group of bits of the data registers together with their function and their active/inactive values. Their order in a scan chain is also specified. The preferred format used is an extension of HSDL (Hierarchical Scan Description Language). In the following example, a diagnostic register of controller 0 (BP0) has 216 bits and is accessed using instruction

```
BP0_DIAG_MODE:attribute REGISTER_ACCESS    of TOP:    entity is
    "BP0_DIAG_REG1[216]       ( BP0_DIAG_MODE       ),"&
    "BP0_LONG_SETUP_REG[78]   ( BP0_DATALOGGER_SETUP),"&
``` iii. Bus Composition

A bus composition sub-section delineates the names of each group of bits (bus) associated with a register. In the following example, bits 31 to 34 of a register called LONG_SETUP_REG of controller BP0 form an address counter called ADD_CNT:

```
attribute BUS_COMPOSITION of TOP: entity is
    "BP0_ADD_CNT[4]      ( BP0_LONG_SETUP_REG[31,34]    ),"&
```

(b) Pattern and Protocol

A Pattern and Protocol section describes the data patterns to be applied to the inputs and/or loaded into the internal data registers for each mode of operation, the expected values at the test controller outputs, and the outputs shifted out of internal data registers.

These input patterns and output response are applied according to a protocol which indicates the sequence used to apply the patterns. For example, the protocol may stipulate that the data be applied to the internal data registers needs one bit at a time via the serial input of the controller. The protocol may vary according to the context of the simulation/test. A first protocol (direct pin) is used whenever the inputs and outputs of the controller are directly accessible. A second protocol is used when the controller is connected to a Test Access Port (TAP) such as that described in the IEEE 1149.1 standard. The instruction register and, possibly, the internal data registers of the TAP need to be accessed prior to use the test controller. Note that the TAP has its own controller information file. The following is a very simplified example of a protocol implementing a test for a controller:

```
Protocol (JTAP) {
ApplyTest {
    set_valPort(CLK)         "1";       (start applying clock to TAP)
    set_instruction_reg      BIST_ENABLE   BP1; (select controller)
    set_instruction_reg      RUN_MODE      DEFAULT;
        (select default mode of operation of the controller)
    shift_instruction;                   (shift in and apply instruction)
    runtest_loop             1258;       (wait for the test to complete)
    set_instruction_reg_exp  IR_STATUS3_DONE YES;
        (Set expected value for status bit indicating completion)
    set_instruction_reg_exp  IR_STATUS2_GO    PASS;
        (Set expected value for status bit indicating test passed)
    shift_instruction;                   (Shift out status bits and compare)
}
```

(c) Connection Rules

A Connection Rules section describes connection rules for each input and output of the controller. Inputs can be tied to a constant value, an input pin of the module or circuit being verified or to an output of a TAP. Outputs can be left open, connected to an output pin of the module or circuit being verified or to an input of the TAP. Some of these connections may be conditional, e.g. they may exist only if a specific instruction is loaded in the TAP. The following are example connection rules. The first is an input and the second is an output:

```
BIST_DIAG_EN DIAG_EN {
    Allowed: tiedLow,
        directConnect(USER_IR_BIT) when MODE = TAP,
        directConnect(INPUT_PIN) when MODE = DIRECT_PIN;
    ReportConnection: ON;
    Class: CMP_STAT_SHARED_WITH_GO;
MBIST_GO_ID[8:1] CMP_STAT_ID {
    Allowed: open,
        AndConnect(OUTPUT_PIN);
    CheckCondition : ENABLE = 1;
    ReportConnection: ON;
```

(d) Parameter Validation

A Parameter Validation section is provided for use by the verification tool of the present invention to validate parameters contained in a verification specification. The section describes how to validate the parameters based on the information residing in other sections of the controller information file and in a test connection specification.

For example, if a memory test controller section of the verification specification requires running the test controller in diagnostic mode for a memory, this section indicates to the verification tool to check the controller hardware section to determine whether the diagnostic mode exists and check the test connection file to determine whether the inputs and outputs associated with that mode are properly connected to make this mode available. Another check is performed in the controller hardware section to determine whether the memory exists. The parameter validation section also includes appropriate error messages to issue when errors are detected.

In summary, it will be seen that the test structure information file contains all information that will be required to create test benches or test programs which will be used to partially or fully exercise the controller. The combination of all test structure information files constitute a test structure information database. In the preferred form of the invention, the database is in the form of individual controller specific files which are created when the test structure itself is created. The files may be located in controller specific directory in computer memory.

Test Connection Specification

Individual structures in a circuit must be able to be verified independently of other structures. For example, it must be possible to test a test controller by itself to ensure that it operates properly, to test the circuit sub-block which contains the test controller, to test the block which contains the sub-block, and, finally, to test the circuit which contains the block. Blocks may be comprised of blocks and sub-blocks. Thus, at any given phase of the embedded test design phase, some means must be provided to specify the inputs and outputs of the structure to be tested. To that end, the test connection specification contains the connection information required is created. This file is created by design extraction tool 110 which extracts the test architecture of the design. In essence, the tool parses the circuit description and stores a list of all module names in the design. Then, for each module corresponding to a test controller, the tool looks for a corresponding test structure specification with the same base name as the module name in all of predetermined search directories. When the tool locates a matching test controller specification, the tool reads the file, performs connection checks on the test structure based on information in this file and extracts information outlined below from the information file. If the tool does not find a matching information file, the tool moves on to the next module name in the list and repeats the process.

The test connection specification contains at least the following information:
- a list of inputs and outputs of a module or circuit being verified.
- for each test controller contained in the module or circuit:
    - identification of controller type (e.g. memory, logic, PLL, etc . . . );
    - a pointer to the corresponding test structure description file;
    - a connection status including
        - an indication of whether some of the features of the controller are enabled based on the manner in which it is connected;
        - the name of the module input/output to which each controller pin is connected; and
        - a summary indicating whether all connections comply to the connection rules of the controller description file.

The following is an example entry in a test connection file for a controller:

```
ConnectionStatus {
    ASYNC_INTERFACE :   ON ; (asynchronous interface enabled);
    SETUP_MODE              : ON ;
    TCK                     : TCK ; (test clock source for asynchronous interface
                              is TCK)
    CLK_TEST                : CLK ; (test clock source for actual test is CLK)
    DONE                    : IR_STATUS ;
    GO                      : IR_STATUS ;
    (GO and DONE controller outputs connected to Instruction Register TAP
    inputs)
    AUX_SI0                 : D(2) ;
    AUX_SO0                 : D(3) ;
        (diagnostic pins AUX_SI0 and AUX_SO0 connected to functional
        input/output D(2) and D(3)
    CONNECTION_STATUS : GOOD ; (all connections are valid)
```

If the module is an entire circuit, the circuit might contain a TAP and/or Boundary scan (Bscan) register. The TAP has its own controller information file and the Bscan register is described using the standard Boundary Scan Description Language (BSDL).

The test connection specification creation tool uses a test connection file generated for a sub structure of the structure to be verified. For example, if the designer wishes to verify a block and previously generated a test connection specification for a sub-block in the block, the tool will use the information contained in the subsidiary test connection specification rather then re-create all of the information. However, the tool may also be instructed to re-create all test connection information.

Although the present invention has been described in detail with regard to preferred embodiments and drawings of the invention, it will be apparent to those skilled in the art that various adaptions, modifications and alterations may be accomplished without departing from the spirit and scope of the present invention. Accordingly, it is to be understood that the accompanying drawings as set forth hereinabove are not intended to limit the breadth of the present invention, which should be inferred only from the following claims and their appropriately construed legal equivalents.

We claim:

1. A program product for use in generating test benches for verifying test structures embedded in a circuit, comprising:
   a verification specification processor for parsing a verification specification containing test specifications for selected test structures;
   a test bench generator for each of one or more types of embedded test structures, each test bench generator being operable to process a test structure specification of a test structure of a corresponding test structure type and generate a test bench using data contained in said test specifications of said verification specification, data contained in said test structure specification and data contained in a test connection specification,
   said program product being further operable to generate a database containing selected files for use in testing and diagnosing faults in said circuit and in circuits embedded within said circuit.

2. The program product as defined in claim 1, further including means for parsing a circuit description for generating a circuit test connection specification identifying test structures in said circuit, said test connection specification containing a test structure identifier, a test structure type, an identity of a test structure specification and identity of circuit ports to which test structure ports are connected.

3. The program product defined in claim 2, said means for parsing being further operable to parse test connection specifications associated with embedded blocks to include within said circuit test connection specification, test connection specifications for test structures in said embedded blocks and including a test structure identifier, a test structure type, an identity of a test structure specification and identity of circuit ports to which test structure ports are connected.

4. The program product defined in claim 2, each said test bench generator being operable to extract from a test connection specification the identity and location of a test structure specification and connections between a test structure and the module in which the test structure is embedded, extract from said test structure specification test structure specific information required in a test bench; and extract from a verification specification, parameters to be used in generating said test benches.

5. The program product defined in claim 4, each said test bench generator including means for accessing a test controller specification having:
   a controller hardware section delineating a controller type, controller inputs and outputs, and controller internal data registers used to configure the controller in various test and diagnosis modes, including:
      an Opcodes sub-section delineating the name of each controller instruction and bit values to be loaded into an instruction register of a TAP to configure the TAP controller and test controller in a particular state;
      a register access sub-section delineating the names of each controller data register and the instruction with which the data register is associated;
      a bus composition sub-section delineating the name of each group of bits associated with each register of the controller;
   a pattern and protocol section specifying data patterns to be applied to the inputs and/or loaded into the test controller internal data registers for each mode of operation, the expected values at test controller outputs, and the outputs shifted out of internal data registers, and the protocol to be used in accessing said controller;
   a connection rule section containing connection rules for each input and output of the controller; and
   a parameter validation section for validating parameters in a verification specification.

6. The program product defined in claim 2, further including:
   a verification specification generator for grouping test structures identified in said test connection specification by test structure type, each test structure type group defining one or more test step specifications for one or more test structures of the same test structure type, and providing for each said test structure group global test structure type parameters and test steps for verifying test structures of said test structure type.

7. The program product defined in claim 6, said verification specification generator further grouping test structures of test structure type groups into one or more sub-groups.

8. The program product defined in claim 7, said sub-groups including hierarchical sub-groups, frequency sub-groups, and power consumption sub-groups.

9. The program product defined in claim 6, said verification specification generator further incorporating into a specific verification section, test specifications for each embedded block in said circuit for use in generating test benches for verifying test structures in said embedded block.

10. The program product defined in claim 6, said verification specification generator having one or more modes for generating one or more types of verification specifications.

11. The program product defined in claim 10, said one or more modes including an early verification mode for use in performing an accelerated, preliminary verification of test structures in said circuit.

12. The program product defined in claim 10, said one or more modes including a scan verification mode for use in verifying scan related structures in said circuit.

13. The program product defined in claim 10, said one or more modes including a sign-off verification mode for generating a first verification specification for use in performing a complete verification of all test structures in said circuit prior to manufacture of said circuit and a second verification specification for use in testing said circuit after manufacture of said circuit.

14. The program product defined in claim 10, said verification specification generator being further operable to insert circuit specific data at place holder locations in said verification specification.

15. The program product defined in claim 2, further including a clock specification generator for parsing said test connection specification and identifying a clock source driving each test controller module and creating a clock specification identifying each clock source and a corresponding clock period, said verification specification generator being operable to extract clock period values from said clock specification and insert said values where required in said verification specification.

16. The program product defined in claim 1, further including:
control means for processing said verification specification and, for each test structure type group, invoking a test bench generator corresponding to the test structure type of the test structure type group and passing to said test bench generator global parameters and test specifications associated with said group.

17. The program product defined in claim 1, further including a command processor responsive to an input for determining a circuit to be verified, a verification type to be performed and test structures to be verified.

18. The program product defined in claim 1, said verification specification processor being responsive to user input for selectively including or excluding test structures.

19. The program product defined in any of claims 2 to 15, said test connection specification including for each test controller in said circuit:
identification of controller type;
a pointer to a test controller specification;
a connection status indicating whether some test structure features are enabled;
a circuit input or output name to which each test structure pin is connected; and
a summary indicating whether all connections comply to connection rules of the test controller specification.

20. A method of generating test benches for a circuit having embedded test structures, comprising:
generating a test connection specification identifying embedded test structures in said circuit;
generating a verification specification having a specific verification section in which said test structures are grouped by test structure type and each test structure type group includes test structure type global parameters and parameters for each of predetermined test steps required to verify test structures in said group; and
generating a test bench corresponding to each test structure type group.
said generating a test connection specification comprising parsing a circuit description of said circuit and including in said test connection specification, the identity and type of each test controller in said circuit, port names of circuit and test controller connections, and a pointer to a test controller specification.

21. The method as defined in claim 20, said generating a verification specification further including arranging test structures in said circuit into hierarchical groups, arranging test structures in each hierarchical group into test structure type groups, providing one or more test steps for each test structure type group and specifying one or more test structures of the same type for each said test step.

22. The method as defined in claim 20, said generating a verification specification further including arranging test structures in said circuit into frequency groups, arranging each frequency group into test structure type groups, providing one or more test steps for each test structure type group and specifying one or more test structures of the same type for each said test step.

23. The method as defined in claim 20, said generating a verification specification having a specific verification section including extracting said test structure type global parameters from a test structure type library.

24. The method as defined claim 20, said generating a test bench corresponding to each said verification section includes using said global parameters and extracting from a test structure specification for a test structure corresponding to the verification section, operational codes to be applied to said test structure to perform said test steps.

25. The method as defined in claim 20, said generating a verification specification including generating a global property section containing parameters applicable to all embedded test structure types.

26. The method as defined in claim 20, said generating a verification specification including generating a tester related data section; and, for circuits containing scan-inserted logic, generating a vector generation section containing parameters for use in generating vectors for testing scan-inserted logic in said circuit.

27. The method as defined in claim 26, further including generating and storing test vectors according to parameters contained in said vector generation section.

28. The method as defined in claim 20, said inserting a specific verification section including extracting said test structure type global parameters from a test structure type library.

29. The method as defined in claim 28, said generating a test bench includes using said global parameters and extracting from a test structure specification operational codes to be applied to said test structure to perform said test steps.

30. The method as defined in claim 29, said generating a verification specification including generating a global property section containing parameters applicable to all embedded test structure types.

31. The method as defined in claim 30, said generating a verification specification including generating a tester related data section; and, for circuits containing scan-inserted logic, generating a vector generation section containing parameters for testing scan-inserted logic.

32. The method as defined in claim 31, further including generating and storing test vectors according to parameters contained in said vector generation section.

33. A method for generating test benches for operationally verifying embedded test structures in a circuit, comprising:
specifying embedded test structures to be verified;
parsing a verification specification containing test specifications for test structures in said circuit, said test specifications being grouped by test structure type, each test structure type group containing test structure type global parameters, test step parameters for verifying test structures within said group and test structure specific parameters; and
for each specified test structure type group, generating a test bench according to said global parameters, test parameters and test structure specific parameters,
further including generating said verification specification prior to said parsing a verification specification.

34. The method as defined in claim 33, said generating a verification specification including:
  arranging said test structures into hierarchical groups;
  arranging test structures in each hierarchical group into test structure type groups;
  providing one or more test steps for each test structure type group; and
  specifying one or more test structures of the same type for each said test step.

35. The method as defined in claim 34, said generating a verification specification including:
  arranging said test structures into frequency groups;
  arranging test structures in each frequency group into test structure type groups;
  providing one or more test steps for each test structure type group; and
  specifying one or more test structures of the same type for each said test step.

36. The method as defined in claim 33, said generating a verification specification including:
  arranging said test structures into frequency groups;
  arranging test structures in each frequency group into test structure type groups;
  providing one or more test steps for each test structure type group; and
  specifying one or more test structures of the same type for each said test step.

37. The method as defined in claim 33, said generating said verification specification including:
  inserting a specific verification section into said verification specification;
  inserting into said specific verification section, a test structure type section for each type of test structure in said circuit;
  inserting into said test structure type section:
    global test structure type parameters applicable to all test structures of said test structure type for use in generating a test bench;
    one or more test step sections for use in verifying each mode of operation of each test structure of said test structure type;
  inserting into each said one or more test step section, a test structure section for each test structure of said test structure type in said circuit; and
  inserting into each test structure section, test structure specific parameters for generating a test bench.

38. The method as defined in claim 37, further including, for each embedded block in said circuit, inserting an embedded block specific verification section containing test structure type sections, test step sections, and test structure sections for each test structure in said embedded block.

39. The method as defined in claim 37, for a circuit which is a sub-block in a parent circuit, said generating a verification specification including generating a verification specification type for verifying a individual sub-block test structure, said method including:
  said inserting a test structure type section comprising inserting a single test structure type section into said specific verification section corresponding to a type of test structure for testing said sub-block;
  said test structure type section having a test step section for each mode of operation of said sub-block test structure with each test step section having a test structure containing specific parameters for operating said sub-block test structure in a respective mode of operation; and
  said inserting global and specific parameters including parameters for performing only a partial verification so as to accelerate verification of said sub-block test structure.

40. The method as defined in claim 39, for a circuit which is a block having one or more embedded test structures therein for testing one or more types of sub-blocks, said generating a verification specification further including:
  inserting a verification section for each embedded block in said block;
  said inserting global and specific parameters including parameters for performing only a partial verification so as to accelerate verification of said sub-block test structure.

41. The method as defined in claim 37, for a circuit which is a top module having one or more embedded test structures therein for testing one or more types of sub-blocks, said generating a verification specification further including:
  inserting into said specific verification section, a section for each top module test structure, a scan verification section; and a logic test structure section with each said section having one or more test step sections for testing each mode of operation of each structure corresponding to said section; and
  inserting a vector generation section containing parameters for use in generating scan and logic test vectors.

42. The method as defined in claim 33, said generating said verification specification including generating a verification specification corresponding to a specified verification specification type.

43. The method as defined in claim 33, said generating a verification specification corresponding to a specified specification type including generating an early verification type verification specification for use in verifying the correctness of a test structure and of interaction of said test structure with a corresponding sub-circuit or component to be tested by said test structure.

44. The method as defined in claim 33, said generating a verification specification corresponding to a specified specification type including a scan verification specification type for verification of the scan test structures in said circuit, including:
  inserting a vector generation section in said verification specification with parameters for generating a number of vectors; and
  inserting into said specific verification section a section associated with scan test structures and having test step sections for exercising scan test structures in each mode of operation thereof.

45. The method as defined in claim 33, further including, prior to said generating a verification specification:
  generating a test structure clock specification identifying clocks used to drive test controllers and a corresponding clock period; and
  using said clock specification as input in creating a said verification specification, said verification specification having default values for design-specific embedded test parameters.

46. The method as defined in claim 45, further including editing said verification specification to replace default values with desired values.

47. The method as defined in claim 45, said clock specification identifying default values of each test structure clock pin and a corresponding clock period.

48. The method as defined in claim 33, said generating a verification specification includes generating one or more of the following:

a sub-block verification specification for use in verifying a sub-block of said circuit;

a scan verification specification for use in verifying scan related structures in said circuit;

a top level verification specification for use in verifying a scan-inserted circuit and a logic test controller;

a sign-off verification specification for use in performing a final verification of all embedded test structures in said circuit; and a manufacturing verification specification for use in generating a test patterns for testing embedded test structures in said circuit during manufacturing.

49. The method as defined in claim 48, said sub-block verification specification includes:

a global property section parameters applicable to all embedded test logic types; and a specific verification section containing a wrapper for each embedded test structure type.

50. The method as defined in claim 48, said scan verification specification includes:

a global property section containing parameters applicable to all embedded test logic types;

a scan vector generation section for use in specifying scan vector generation parameters; and a specific embedded test structure verification section for scan-inserted logic.

51. The method as defined in claim 48, said top level verification specification includes:

a global property section containing parameters applicable to all embedded test logic types;

a scan vector generation section containing information respecting scan and logic test patterns to be used during verification; and a specific verification section having sub-sections for scan and logic BIST partial verification and sub-sections for all controller types.

52. The method as defined in claim 48, said sign-off verification specification includes:

a global property section for parameters applicable to all embedded test logic types;

a tester related data section for identifying a tester to be used in testing said circuit;

a scan vector generation section including parameters about scan and logic test patterns to be used, a specific verification section having:
 sub-sections for scan and logic test verification; and
 sub-sections for all other test controller types in said circuit.

53. The method as defined in claim 48, said manufacturing test program generation specification includes:

a global property section containing parameters applicable to all embedded test logic types;

a tester section containing tester related data;

a specific verification section including:
 sub-sections for scan and logic BIST test program generation; and
 sub-sections for all other controller types.

54. The method as defined in claim 33, said specifying embedded test structures to be verified comprising specifying inclusion or exclusion of any sections in said specific verification section of said verification specification.

55. The method as defined in any one of claims 49 to 53, said parameters including identification of clock pins and associated clock periods.

* * * * *